(12) United States Patent
Sommerschuh et al.

(10) Patent No.: US 10,281,130 B2
(45) Date of Patent: May 7, 2019

(54) LIGHT-EMITTING DEVICE FOR AN AUTOMOTIVE VEHICLE HEADLAMP LIGHTING MODULE AND ASSOCIATED LIGHTING MODULE AND HEADLAMPS

(71) Applicant: Valeo Vision, Bobigny (FR)

(72) Inventors: Stephan Sommerschuh, Paris (FR); Lotfi Redjem Saad, Paris (FR)

(73) Assignee: Valeo Vision, Bobigny (FR)

( * ) Notice: Subject to any disclaimer, the term of this patent is extended or adjusted under 35 U.S.C. 154(b) by 158 days.

(21) Appl. No.: 15/357,187

(22) Filed: Nov. 21, 2016

(65) Prior Publication Data

US 2017/0153003 A1 Jun. 1, 2017

(30) Foreign Application Priority Data

Nov. 27, 2015 (FR) ...................... 15 61526

(51) Int. Cl.
| | | |
|---|---|---|
| *F21V 9/30* | (2018.01) | |
| *H01S 5/00* | (2006.01) | |
| *F21S 41/16* | (2018.01) | |
| *F21S 41/19* | (2018.01) | |
| *F21S 41/20* | (2018.01) | |

(Continued)

(52) U.S. Cl.
CPC ............ *F21V 29/763* (2015.01); *F21S 41/16* (2018.01); *F21S 41/19* (2018.01); *F21S 41/192* (2018.01); *F21S 41/285* (2018.01); *F21S 45/47* (2018.01); *F21S 45/49* (2018.01); *F21V 9/30* (2018.02); *H01S 5/005* (2013.01);
(Continued)

(58) Field of Classification Search
CPC .. F21S 41/14; F21S 41/16; F21S 41/19; F21S 41/192; F21S 45/47; F21Y 2115/30; F21V 29/763; F21V 17/101; F21V 9/30; H01S 5/0226
See application file for complete search history.

(56) References Cited

U.S. PATENT DOCUMENTS 7,425,081 B2 * 9/2008 Cunnien ............. B60Q 1/2696
362/249.16
7,457,334 B2 11/2008 Cho
(Continued)

FOREIGN PATENT DOCUMENTS

CN 204678211 U 9/2015
DE 2312018 A1 9/1974
(Continued)

*Primary Examiner* — Peggy A Neils
(74) *Attorney, Agent, or Firm* — Oblon, McClelland, Maier & Neustadt, L.L.P.

(57) ABSTRACT

A light-emitting device for an automotive vehicle headlamp lighting module, that includes a light source, comprising
a carrier comprising two opposite faces, a first face forming a first joining surface;
an optoelectronic chip that is fastened to the second face of the carrier;
connecting pins that stick out with respect to the first face of the carrier and that are connected to the chip;
the light-emitting device furthermore including a heat exchanger comprising a second joining surface that is connected to the first joining surface.
The two joining surfaces are joined to each other by means of an adhesive material; each of the connecting pins includes a portion extending radially in the adhesive material; and the connecting pins do not pass through the second joining surface.

15 Claims, 2 Drawing Sheets

(51) Int. Cl.
    F21S 45/47    (2018.01)
    F21S 45/49    (2018.01)
    F21V 29/76    (2015.01)
    H01S 5/022    (2006.01)
    H01S 5/024    (2006.01)
    F21Y 115/30   (2016.01)

(52) U.S. Cl.
    CPC ....... H01S 5/02469 (2013.01); *F21Y 2115/30* (2016.08); *H01S 5/02212* (2013.01)

(56) References Cited

U.S. PATENT DOCUMENTS

| | | | | |
|---|---|---|---|---|
| 8,391,009 | B2* | 3/2013 | Horng | H01L 23/3677 |
| | | | | 361/707 |
| 8,974,089 | B2* | 3/2015 | Takahira | F21K 9/56 |
| | | | | 362/293 |
| RE45,805 | E* | 11/2015 | Kim | G02F 1/133308 |
| 9,335,022 | B2 | 5/2016 | Lee | |
| 9,477,145 | B2* | 10/2016 | Higo | G03B 21/204 |
| 9,625,113 | B2* | 4/2017 | Mitterlehner | F21S 48/1145 |
| 9,829,165 | B2* | 11/2017 | Zojceski | F21S 48/1104 |
| 9,863,595 | B2* | 1/2018 | Takahira | B60Q 1/0023 |
| 9,976,721 | B2* | 5/2018 | Tsuda | H01S 5/40 |
| 2005/0265410 | A1 | 12/2005 | Cho | |
| 2014/0029282 | A1 | 1/2014 | Ravier et al. | |
| 2014/0293631 | A1 | 10/2014 | Lee | |
| 2016/0061424 | A1 | 3/2016 | Hatanaka et al. | |
| 2016/0290621 | A1* | 10/2016 | Ozawa | F21S 43/195 |
| 2017/0240094 | A1* | 8/2017 | Kunecke | B60Q 1/0023 |
| 2017/0248288 | A1* | 8/2017 | Einig | F21S 41/19 |

FOREIGN PATENT DOCUMENTS

| | | |
|---|---|---|
| DE | 202010005819 U1 | 9/2010 |
| DE | 102011076765 A1 | 12/2012 |
| EP | 2690352 A1 | 1/2014 |

* cited by examiner

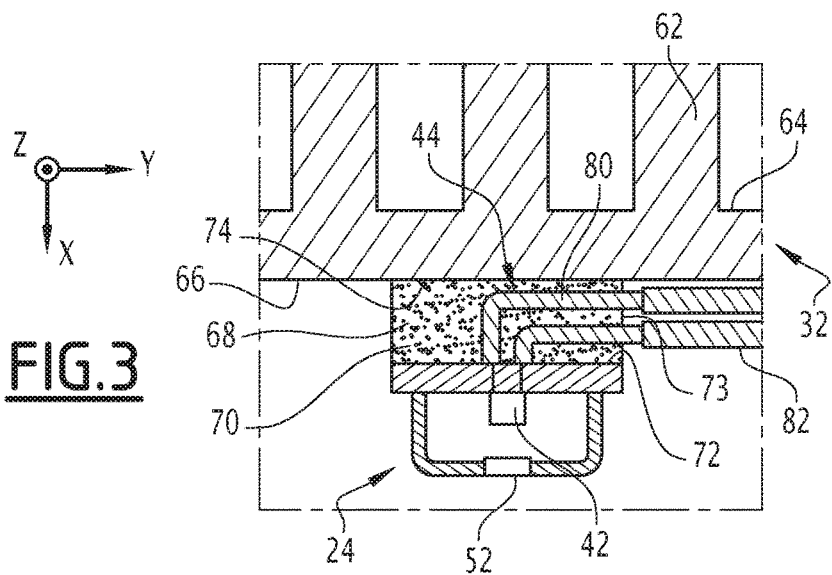
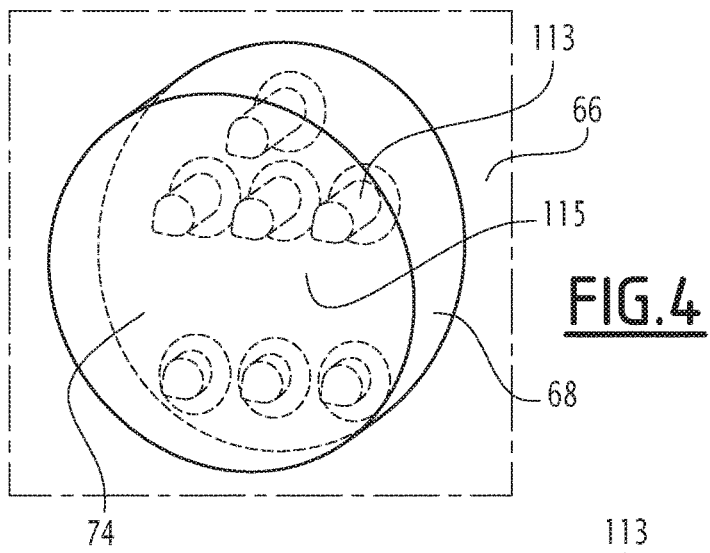
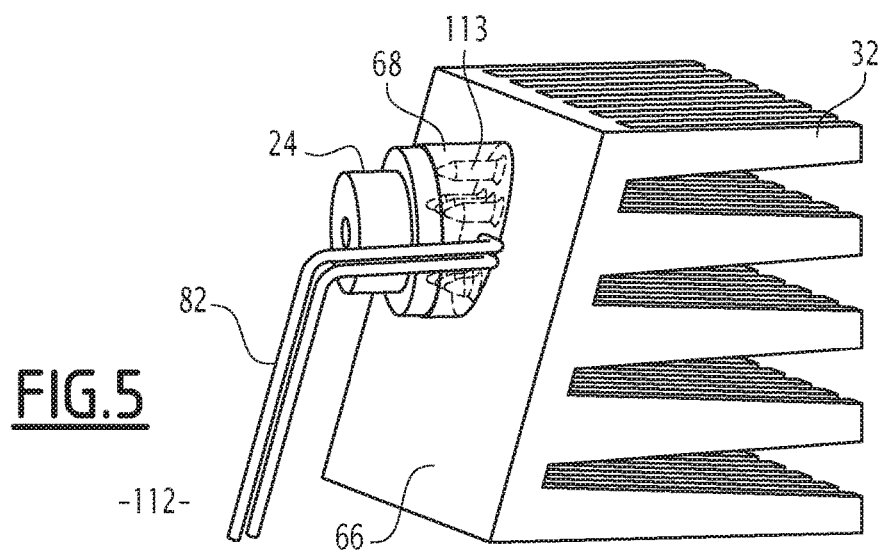

LIGHT-EMITTING DEVICE FOR AN AUTOMOTIVE VEHICLE HEADLAMP LIGHTING MODULE AND ASSOCIATED LIGHTING MODULE AND HEADLAMPS

CROSS-REFERENCE TO RELATED APPLICATIONS

This application claims priority to the French application 1561526, filed Nov. 27, 2015, which application is incorporated herein by reference and made a part hereof.

BACKGROUND OF THE INVENTION

1. Field of the Invention

The present invention relates to a light-emitting device for an automotive vehicle headlamp lighting module.

2. Description of the Related Art

It is known to provide, at the front of an automotive vehicle, headlamps able to form light beams for providing various lighting functions such as, for example, a "low-beam" or "high-beam" function.

The lighting devices referred to as adaptive lighting devices allow the intensity, the dimensions and/or the direction of the beams to be adjusted depending on traffic conditions, in order to provide these various functions.

Each headlamp in general includes a plurality of lighting modules that allow a light beam of the headlamp to be formed. The modules may be turned on or off independently of one another in order to vary in real-time the characteristics of the beam.

The expression «lighting module » is understood to mean an assembly containing at least one light source and a projecting or reflecting optical system.

Lighting modules, such as described in document EP2690352 in the name of the Applicant, especially comprise light-emitting devices including laser diodes emitting blue light, and a device able to convert the laser radiation into a beam of white light. Such a converting device for example consists of luminophorous elements.

As the laser diodes generate a substantial amount of heat in operation, it is necessary to associate them with a radiator heat exchanger in order to cool them.

The laser diodes conventionally used in lighting modules are of the type described in document U.S. 2005/0265410, which is issued as U.S. Pat. No. 7,457,334. These diodes especially include electrical connecting pins, which are located on a face opposite the light radiation.

Frequently, the diode is joined to the radiator at the face bearing the connecting pins. It is then necessary to make provision in the radiator for a through-orifice to accommodate the pins. This orifice decreases the area of heat exchange with the diode, thereby degrading the effectiveness of the radiator.

SUMMARY OF THE INVENTION

The aim of the present invention is to propose an improvement to existing light-emitting devices and in particular to thereby optimize the effectiveness of the heat exchanger of the light source of the devices.

To this end, the present invention relates to a light-emitting device for an automotive vehicle headlamp lighting module that includes a light source placed along a main emission axis, the light source comprising: a carrier comprising first and second opposite faces, the first face forming a first joining surface that is substantially orthogonal to the main emission axis; an optoelectronic chip that is fastened to the second face of the carrier; connecting pins that are fastened to the first face of the carrier and that stick out with respect to the first joining surface, the pins being electrically connected to the optoelectronic chip; the light-emitting device furthermore including a heat exchanger able to cool the light source, the heat exchanger comprising a second joining surface that is connected to the first joining surface of the light source, wherein: the first and second joining surfaces are joined to each other by means of a layer of adhesive material; each of the connecting pins includes a portion extending radially in the layer of adhesive material; and the connecting pins do not pass through the second joining surface.

According to other advantageous aspects of the invention, the light-emitting device includes one or more of the following features either alone or in any technically possible combination:

- the second joining surface is continuous and includes no orifice;
- the first and second joining surfaces are inclined with respect to each other;
- the heat exchanger includes at least one relief with respect to the second joining surface, the relief being embedded in the layer of adhesive material;
- the adhesive material incorporates particles able to increase a thermal conductivity of the material;
- the light-emitting device furthermore comprises an optical device able to concentrate the light emitted by the light source and/or a reflector able to deviate the light emitted by the light source.

The invention furthermore relates to an automotive vehicle headlamp lighting module, comprising at least one light-emitting device such as described above.

According to other advantageous aspects of the invention, the lighting module includes one or more of the following features either alone or in any technically possible combination:

- the light source is a laser diode and the module furthermore comprises a device for converting the wavelength of the light emitted by the laser diode, and an imaging optical system able to form at infinity an image of beams emitted by the converting device;
- the module includes a holder, the holder comprising a central wall and two lateral walls that are substantially aligned in a plane substantially perpendicular to an optical axis of the imaging optical system, the wavelength-converting device being fastened to the central wall, a light-emitting device such as described above being fastened to each of the lateral walls, the light source of each of the light-emitting devices being a laser diode.

The invention furthermore relates to an automotive vehicle headlamp, comprising at least one lighting module such as described above.

These and other objects and advantages of the invention will be apparent from the following description, the accompanying drawings and the appended claims.

BRIEF DESCRIPTION OF THE ACCOMPANYING DRAWINGS

The invention will be better understood on reading the following description which is given merely by way of nonlimiting example and with reference to the drawings, in which:

FIG. 3 is a partial schematic cross-sectional view of the light-emitting device in FIG. 2;

FIG. 4 is a perspective view of a detail of a light-emitting device according to another embodiment of the invention; and FIG. 5 is a partial perspective view of the light-emitting device in FIG. 4.

DETAILED DESCRIPTION OF THE PREFERRED EMBODIMENTS

Figure 1:
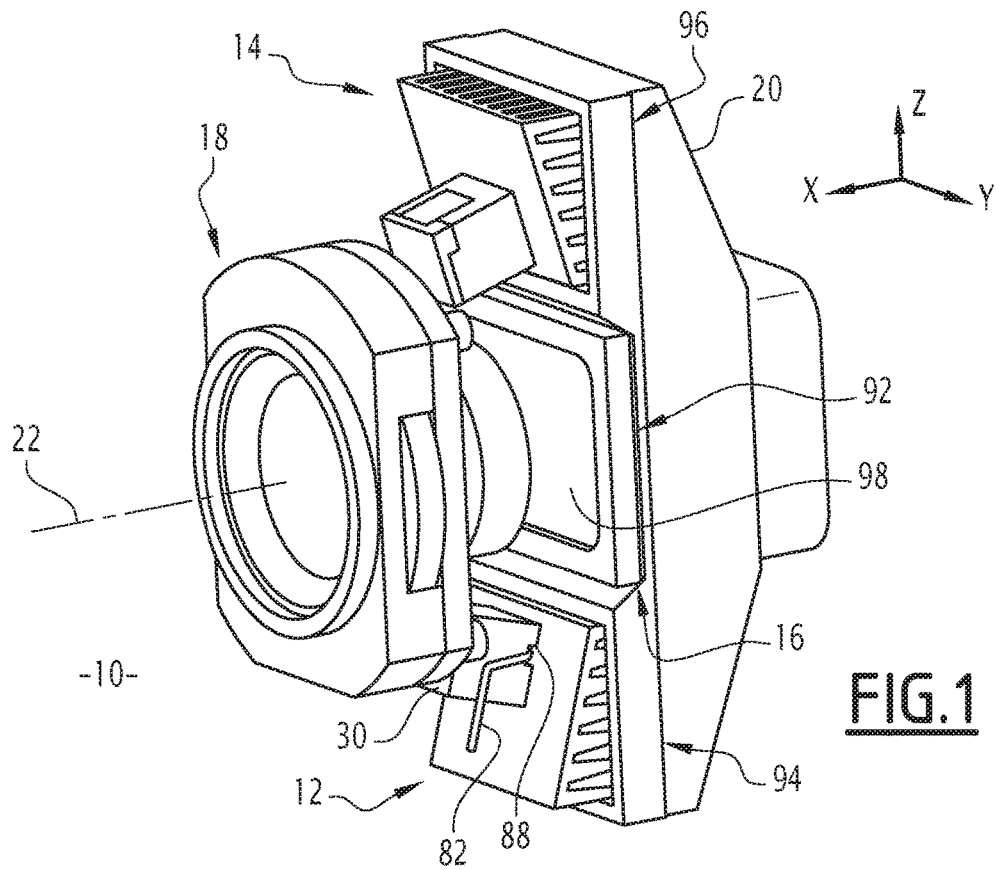
FIG. 1 is a perspective view of a lighting module according to one embodiment of the invention, comprising two light-emitting devices.

FIG. 1 shows in perspective a lighting module 10 according to a first embodiment of the invention.

The lighting module 10 is intended to be incorporated in an automotive vehicle headlamp, the headlamp possibly comprising one or more other lighting modules.

The lighting module 10 includes first light-emitting device 12 and a second light-emitting device 14, a wavelength-converting device 16 and an imaging optical system 18.

The lighting module 10 furthermore includes a holder 20 to which the first light-emitting device 12 and the second light-emitting device 14 and the wavelength-converting device 16 are fastened.

Figure 2:
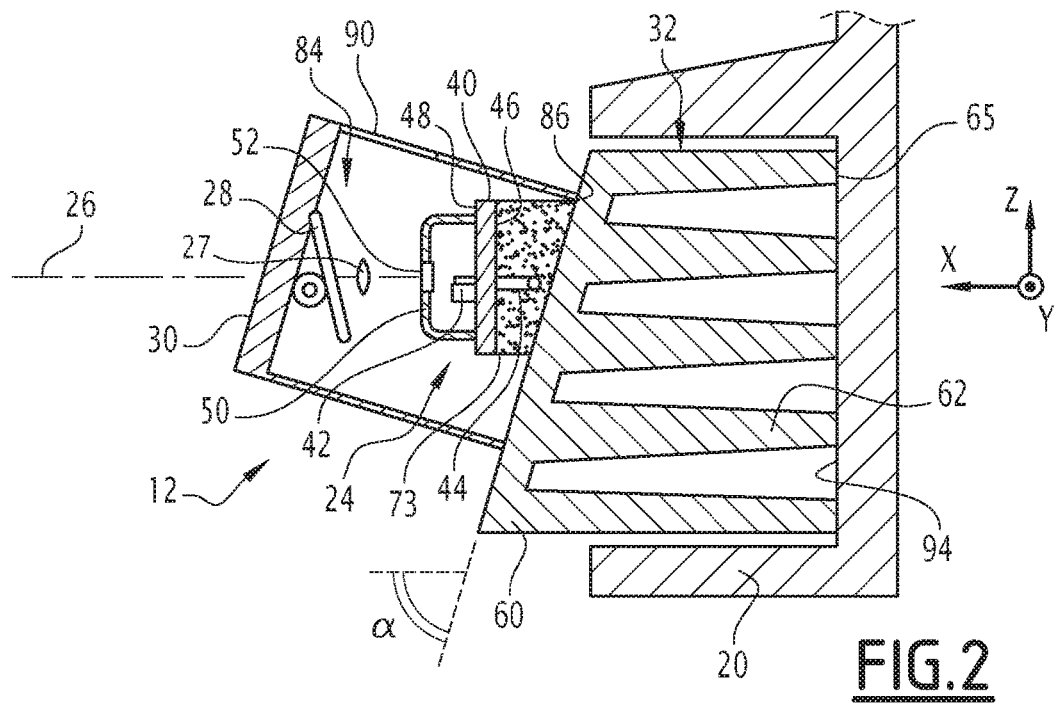
FIG. 2 is a cross-sectional schematic view of a light-emitting device of the module in FIG. 1.

Reference is made to an orthonormal coordinate system (X, Y, Z) shown in FIGS. 1, 2 and 3. The horizontal axes X and Y are parallel and perpendicular to an optical axis 22 of the imaging optical system 18, respectively; the Z-axis is vertical.

FIGS. 2 and 3 respectively show a cross-sectional view of the first light-emitting device 12. The following description of the first light-emitting device 12 is applicable to the second light-emitting device 14.

The first light-emitting device 12 includes a light source 24 placed along a main emission axis 26 that is parallel to X. In the embodiment in FIGS. 1 to 3, the light source 24 is a laser diode.

The laser diode 24 for example emits a visible beam the wavelength of which is comprised between 400 nm and 500 nm and preferably between 440 nm and 470 nm. The laser diode 24 is described in detail below.

The first light-emitting device 12 furthermore includes an optical device 27 able to concentrate the beam emitted by the laser diode 24. The optical device 27 is placed substantially on the main emission axis 26.

The first light-emitting device 12 furthermore includes a reflector 28 able to send light radiation emitted by the laser diode 24 and concentrated by the optical device 27 to the wavelength-converting device 16. Preferably, the reflector 28 is movable in one or two directions, so as to form a scanning system. According to one embodiment, the reflector 28 is formed from a plurality of mirrors that are movable independently. As a variant, the reflector 28 is static.

The first light-emitting device 12 furthermore includes: a housing 30, enclosing the laser diode 24, the optical device 27 and the reflector 28; and a heat exchanger 32 that is joined to the laser diode 24.

As shown in FIGS. 2 and 3, the laser diode 24 especially includes a carrier 40, an optoelectronic chip 42 and electrical connecting pins 44.

The carrier 40 is substantially puck-shaped and comprises opposite first and second faces 46, 48 that are substantially placed in (Y, Z) planes.

The electrical connecting pins 44 stick out with respect to the first face 46 of the carrier 40. In the embodiment shown in FIGS. 2 and 3, the laser diode 24 includes two electrical connecting pins 44.

The optoelectronic chip 42 is fastened to the second face 48 of the carrier 40. By "optoelectronic chip", what is meant is an electronic component that emits light when it is supplied with electrical power. The optoelectronic chip 42 is electrically connected to the electrical connecting pins 44 through the carrier 40.

The laser diode 24 furthermore includes a cap 50 fastened to the second face 48 of the carrier, around the chip 42. The cap 50 includes a window 52 that is aligned with the optoelectronic chip 42 along the main emission axis 26, so as to allow the laser radiation emitted by the optoelectronic chip 42 to exit.

In the embodiment in FIGS. 1 to 3, the heat exchanger 32 is a radiator especially comprising a base 60 and fins 62. The base 60 and fins 62 are preferably integrally formed, especially by molding or machining, from a material of good thermal conductivity. The material is preferably a metal such as aluminum.

The base 60 has a substantially planar shape and is placed in a plane parallel to Y, the plane being inclined by an angle α with respect to X. The angle α is smaller than 90° and preferably comprised between 45° and 80° and more preferably comprised between 60° and 70°.

The fins 62 have an elongate shape and extend along X from a first face 64 of the base 60. The ends 65 of the fins 62 opposite the first face 64 are placed in a (Y, Z) plane.

A second face 66 of the base 60 is joined to the first face 46 of the carrier 40 of the laser diode 24. The first and second faces 46, 66 being inclined with respect to each other, they are joined by means of an adhesive layer 68 of adhesive material 70.

More precisely, the first face 46 of the carrier 40 forms a first joining surface 72 having a substantially circular outline. The circular outline forms the base of a cylindrical external surface 73 of the adhesive layer 68, extending along X as far as a second joining surface 74 belonging to the second face 66 of the base 60. The second joining surface 74 has an oval outline corresponding to the projection of the first joining surface 72 in the inclined plane of the base 60.

The adhesive material 70 is for example an epoxy adhesive incorporating particles able to increase a thermal conductivity of the adhesive. The particles are for example silver particles.

As may be seen in FIG. 3, the electrical connecting pins 44 of the laser diode 24 do not pass through the second joining surface 74. More particularly, the electrical connecting pins 44 are integrally located on the same side of the base 60 as the carrier 40 of the laser diode 24. In addition, the second joining surface 74 is continuous and includes no orifice. Thus, the area of heat exchange between the laser diode 24 and the radiator 32 is optimized.

Each of the electrical connecting pins 44 includes a portion 80 extending in the adhesive layer 68 radially, i.e. perpendicularly to X. In the example in FIGS. 2 and 3, each portion 80 extends along Y. Each portion 80 emerges through the cylindrical external surface 73 and is hooked up to an electrical wire 82.

The housing 30 defines an internal space 84 containing the diode 24 and the reflector 28. An edge 86 of the housing 30 is fastened to the second face 66 of the base 60, closing the internal space 84. The edge 86 includes a notch 88 (FIG. 1) allowing the electrical wires 82 to pass out of the housing 30 and to be connected to an electrical supply of the laser diode 24.

The housing 30 furthermore includes a lateral aperture 90 allowing the light radiation emitted by the laser diode 24 and deviated by the reflector 28 to exit toward the wavelength-converting device 16.

The holder 20 includes a central wall 92 and two lateral walls 94, 96. The walls 94, 96 are substantially planar, placed substantially in the same (Y, Z) plane and oriented along X in the direction of the imaging optical system 18. The central wall 92 is placed between the lateral walls 94, 96 along Z.

Each of the first light-emitting device 12 and the second light-emitting device 14 is fastened to a lateral wall 94, 96. More precisely, the free ends 65 of each radiator 32 are fastened to a lateral wall, as may be seen in FIG. 2 for a first lateral wall 94. The inclination of the second face 66 of the base 60 is placed so as to orient the second face 66 toward the optical axis 22 of the imaging optical system 18.

The wavelength-converting device 16 is fastened to the central wall 92. The wavelength-converting device 16 is for example formed from a plate of a substrate that is reflective to the laser radiation, on which substrate a continuous and uniform layer 98 of luminophore is deposited.

The layer 98 of luminophore is placed in proximity to the focal plane of the imaging optical system 18. The imaging optical system 18 for example comprises one or more lenses (not shown).

A method of operating the lighting module 10 will now be described. When each of the laser diodes 24 is supplied with electricity, it emits laser radiation that is sent toward the wavelength-converting device 16 by the reflector 28. If the reflector 28 forms a scanning system, a plurality of points of the layer 98 of luminophore receive in succession the laser radiation of the laser diode 24.

As is known, each point of the layer 98, receiving the coherent and monochromatic "blue" laser radiation reemits light that is considered to be "white", i.e. light including a plurality of wavelengths comprised between about 400 nm and 800 nm.

The imaging optical system 18 then forms at infinity an image of the light-emitting points of the layer 98 of luminophore, in the form of a light beam able to illuminate the road in front of a vehicle.

The heat given off by each laser diode 24 is dissipated by the radiator 32, by way of the adhesive layer 68 of adhesive material 70. Overheating of the laser diode 24 is thus prevented.

By way of example, the thermal conductivity of the epoxy adhesive filled with silver particles is comprised between 2 and 10 $W \cdot m^{-1} \cdot K^{-1}$.

However, by way of comparison, the thermal conductivity of the aluminum forming the radiator 32 is 237 $W \cdot m^{-1} \cdot K^{-1}$. Generally, the thermal conductivity of the adhesive material 70 is lower than the thermal conductivities of the materials forming the first and second joining surfaces 72, 74, respectively.

FIGS. 4 and 5 illustrate a light-emitting device 112 according to a second embodiment of the invention, allowing the heat transfer between the laser diode 24 and the radiator 32 to be further improved. The light-emitting device 112 is identical to the light-emitting device 12 described above, except in the components specified below. Components that are common to both the light-emitting devices 12 and 112 are designated by the same reference numbers.

In FIG. 5, only the laser diode 24, the radiator 32, the adhesive layer 68 and the supplying electrical wires 82 of the light-emitting device 112 are shown.

The adhesive layer 68 and the second face 66 of the base 60 of the radiator 32 are shown in detail in FIG. 4. The base 60 includes at least one relief 113 and preferably a plurality of reliefs 113 that extend along X from the second face 66. In particular, the reliefs 113 extend from the second joining surface 74. In the example in FIGS. 4 and 5, the reliefs 113 take the form of spikes that are substantially cylindrical and that terminate in a tip. It is possible for the reliefs to take other forms.

The reliefs 113 are for example integrally formed with the base 60 and the fins 62, especially by molding or machining.

Preferably, a length of the reliefs 113 along X is slightly smaller than the corresponding thickness of the adhesive layer 68. Thus, the reliefs 113 do not make contact with the first joining surface 72 formed by the carrier 40 of the diode 24, in order not to hinder the spatial orientation of the diode during its mounting. As a variant, at least some of the reliefs 113 make contact with the first joining surface 72, in order to improve heat transfer between the diode 24 and the radiator 32.

The reliefs 113 are preferably of different lengths, in order to approach as close as possible to the first joining surface 72 while taking into account the inclination of the base 60 with respect to the X-direction. As shown in FIG. 4, the reliefs 113 are distributed substantially regularly over the second joining surface 74, with the exception of a central zone 115. The central zone 115 is left free for the passage of the electrical connecting pins 44 of the laser diode 24, and especially of the radial portions 80, through the adhesive layer 68.

According to one variant embodiment of the lighting module 10 described above, a light-emitting device 112 is used instead of the first light-emitting device 12 and/or the second light-emitting device. The presence of the reliefs 113 in the interior of the adhesive layer 68 improves the heat transfer between the laser diode 24 in operation and the radiator 32.

A process for manufacturing the light-emitting device 12, 112 will now be described. The housing 30 is firstly assembled with the reflector 28, optical device 27 and laser diode 24, so as to position the main emission axis 26 of the laser diode 24 with respect to the housing 30 and the reflector 28. An adhesive material 70 in the semi-fluid or fluid state is placed on the second joining surface 74 of the radiator 32. In the case of the light-emitting device 112, the adhesive material 70 is placed so that the reliefs 113 are embedded therein. The edge 86 of the housing 30 is then applied to the second face 66 of the base 60, so as to bring the first joining surface 72 of the laser diode 24 into contact with the adhesive material 70. The electrical connecting pins 44 of the laser diode 24 penetrate into the semi-fluid or fluid adhesive. The adhesive is then solidified, so as to form the adhesive layer 68 that fastens together and brings into thermal contact the laser diode 24 and the radiator 32.

In the embodiments described above, the heat exchanger 32 is a finned radiator. As a variant, the heat exchanger 32 includes a duct through which an, in particular liquid, heat-transfer fluid flows. Other types of heat exchangers are usable in the context of the invention.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A light-emitting device for an automotive vehicle headlamp lighting module, said light-emitting device including a light source placed along a main emission axis, said light source comprising:
- a carrier comprising opposite first and second faces, said first face forming a first joining surface that is substantially orthogonal to said main emission axis;
- an optoelectronic chip that is fastened to said second face of said carrier;
- connecting pins that are fastened to said first face of said carrier and that stick out with respect to said first joining surface, said connecting pins being electrically connected to said optoelectronic chip;
- said light-emitting device furthermore including
- a heat exchanger able to cool said light source, said heat exchanger comprising a second joining surface that is connected to said first joining surface of said light source,
- wherein said first and second joining surfaces are joined to each other by means of a layer of adhesive material;
- each of said connecting pins includes a portion extending radially in the said layer of adhesive material between said first joining surface and said second joining surface; and
- said connecting pins do not pass through said second joining surface,
- wherein the said first and second joining surfaces are inclined with respect to each other.

2. The light-emitting device according to claim 1, wherein said second joining surface is continuous and includes no orifice.

3. The light-emitting device according to claim 1, wherein said heat exchanger includes at least one relief with respect to said second joining surface, said at least one relief being embedded in said layer of adhesive material.

4. The light-emitting device according to claim 1, wherein said adhesive material incorporates particles able to increase a thermal conductivity of said adhesive material.

5. The light-emitting device according to claim 1, furthermore comprising an optical device able to concentrate the light emitted by said light source or a reflector able to deviate the light emitted by said light source.

6. An automotive vehicle headlamp lighting module, comprising at least one light-emitting device according to claim 1.

7. The automotive vehicle headlamp lighting module according to claim 6, wherein said light source is a laser diode, said automotive vehicle headlamp lighting module furthermore comprising a device for converting the wavelength of the light emitted by said laser diode, and an imaging optical system able to form at infinity an image of beams emitted by said wavelength converting device.

8. The automotive vehicle headlamp lighting module according to claim 6, wherein said light source is a laser diode, said automotive vehicle headlamp module furthermore comprising
- a device for converting the wavelength of the light emitted by said laser diode, and an imaging optical system able to form at infinity an image of beams emitted by said wavelength-converting device, including a holder,
- said holder comprising
- a central wall and two lateral walls that are substantially aligned in a plane (Y, Z) substantially perpendicular to an optical axis of said imaging optical system,
- said wavelength-converting device being fastened to said central wall,
- said light-emitting device being fastened to each of said two lateral walls, said light source of each of said light-emitting devices being a laser diode.

9. An automotive vehicle headlamp, comprising at least one lighting module according to claim 6.

10. The light-emitting device according to claim 2, wherein said heat exchanger includes at least one relief with respect to said second joining surface, said at least one relief being embedded in said layer of adhesive material.

11. The light-emitting device according to claim 2, wherein said adhesive material incorporates particles able to increase a thermal conductivity of said adhesive material.

12. The light-emitting device according to claim 2, furthermore comprising an optical device able to concentrate the light emitted by said light source and/or a reflector able to deviate the light emitted by said light source.

13. The automotive vehicle headlamp lighting module according to claim 6, wherein said light source is a laser diode, said automotive vehicle headlamp lighting module furthermore comprising
- a device for converting the wavelength of the light emitted by said laser diode, and an imaging optical system able to form at infinity an image of beams emitted by said wavelength-converting device, including a holder,
- said holder comprising
- a central wall and two lateral walls that are substantially aligned in a plane (Y, Z) substantially perpendicular to an optical axis of said imaging optical system,
- said wavelength-converting device being fastened to said central wall,
- said light-emitting device being fastened to each of said two lateral walls,
- said light source of each of said light-emitting devices being a laser diode,
- wherein said second joining surface is continuous and includes no orifice.

14. An automotive vehicle headlamp, comprising at least one lighting module according to claim 7.

15. An automotive vehicle headlamp, comprising at least one lighting module according to claim 8.

* * * * *